United States Patent
Wang et al.

(10) Patent No.: US 7,505,345 B2
(45) Date of Patent: Mar. 17, 2009

(54) CIRCUIT AND METHOD FOR AN SRAM WITH TWO PHASE WORD LINE PULSE

(75) Inventors: Chia Wei Wang, Hsin-Chu (TW); Cheng Hung Lee, Hsin-Chu (TW); Hung-Jen Liao, Hsin-Chu (TW); Fu-Chieh Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 11/811,659

(22) Filed: Jun. 11, 2007

(65) Prior Publication Data

US 2008/0106963 A1 May 8, 2008

Related U.S. Application Data

(60) Provisional application No. 60/856,423, filed on Nov. 3, 2006.

(51) Int. Cl.
*G11C 7/02* (2006.01)

(52) U.S. Cl. .................................. 365/207; 365/230.06

(58) Field of Classification Search ................ 365/207, 365/205, 230.06, 49, 230.08
See application file for complete search history.

(56) References Cited

U.S. PATENT DOCUMENTS 5,280,205 A * 1/1994 Green et al. .................. 327/51

6,417,032 B1 7/2002 Liaw
6,569,723 B2 5/2003 Liaw
2008/0247249 A1 * 10/2008 Lee ............................ 365/205

OTHER PUBLICATIONS

Ohbayashi, S., et al., "A 65 nm SoC Embedded 6T-SRAM Design for Manufacturing with Read and Write Stabilizing Circuits," Digest of Technical Papers, 2006 Symposium on VLSI Circuits, IEEE (2006), 2 pages.
Khellah, M., et al., "Wordline and Bitline Pulsing Schemes for improving SRAM Cell Stability in Low-Vcc 65 nm CMOS Designs," Digest of Technical Papers, 2006 Symposium on VLSI Circuits, IEEE (2006), 2 pages.

* cited by examiner

*Primary Examiner*—Richard Elms
*Assistant Examiner*—Hien N Nguyen
(74) *Attorney, Agent, or Firm*—Slater & Matsil, L.L.P.

(57) ABSTRACT

A circuit and method for providing a two phase word line pulse for use during access cycles in an SRAM memory with improved operating margins. A first and a second timing circuit are provided and a word line voltage suppression circuit is provided to reduce the voltage on the active word lines in a first phase of a word line pulse, and to allow the word lines to rise to a second, unsuppressed voltage in a second phase of the word line pulse, responsive to the first and second timing circuits. The first and second timing circuits observe the bit lines voltage discharge and provide control signals active when the bit lines are discharged past certain thresholds, these signals control the voltage suppression circuit. Operating margins for the SRAM are therefore improved. Methods for operating an SRAM using a two phase word line pulse are provided.

23 Claims, 8 Drawing Sheets

CIRCUIT AND METHOD FOR AN SRAM WITH TWO PHASE WORD LINE PULSE

This application claims the benefit of U.S. Provisional Application No. 60/856,423 filed on Nov. 3, 2006, entitled "Two Stage Suppress Pulse Word Line and Negative Bit Line Design," which application is hereby incorporated herein by reference.

TECHNICAL FIELD

The present invention relates to a circuit and method for providing a read circuits, write circuits and a sense amplifier for use in a static RAM ("SRAM") memory with enhanced margins and performance. The SRAM is manufactured using advanced semiconductor processing technology and small cell size, and the transistors have variable threshold voltages due to the physical characteristics of present advanced semiconductor processes. The circuitry and operation methods of the SRAM are configured to provide improved performance.

BACKGROUND

Present and planned semiconductor processes are providing devices for integrated circuits having process minimum feature sizes of 100 nanometers and smaller. Transistors fabricated in these advanced semiconductor process nodes (usually referred to as "sub-100 nm" nodes) are subject to large variability in the threshold voltages (Vth), even in local areas on the device. As a result, the transistors used to fabricate an SRAM cell, for example, may exhibit a large variability in the threshold voltage Vth. The variability in the threshold voltages has a negative impact on the reliability and performance of the SRAM cell, and this directly affects the operating margins of the cell, such as static noise margin (SNM). In order to maintain the desired production yields required for cost effect manufacture of integrated circuits incorporating the SRAM arrays formed using these SRAM cells, the operating margins must be expanded to compensate for the variable thresholds in the transistor circuits. If this is not done, then many IC devices will fail post manufacture reliability tests, thus the manufacturing yield will fall, and the cost of each integrated circuit that does pass the tests will rise commensurately.

Highly integrated semiconductor circuits are increasingly important, particularly in the field of producing battery operated devices such as cell phones, portable computers such as laptops, notebook and PDAs, wireless email terminals, MP3 audio and video players, portable wireless web-browsers and the like, and these integrated circuits increasingly include on-board data storage. As is known in the art, such storage may take the form of static memory or SRAMs in which arrays of multiple transistor cells are provided, each cell may have for example six transistors to form a "6T" cell, in a well known alternative, a dual ported SRAM circuit may be provided using eight transistors per cell, that is, an "8T" cell may be used. Also, as is known in the memory art, if the individual memory cells are arranged to provide a small voltage output when read, that small voltage can be sensed and amplified by a differential sense amplifier, the area required for each cell may be kept small, and the speed of operation can be increased. Because the sense amplifiers can be shared across many cells, the use of the sense amplifiers does not add significant area to the layout of the memory array.

Static memory offers excellent storage in that no refresh circuitry is required, so long as there is power applied to the SRAM array, the data stored in the cells will be maintained. Dynamic memory or DRAM offers excellent density and required minimum silicon area, and is often provided as fast access memory for a processor, such as a first level cache memory or scratchpad memory. In the prior art it is known to produce both SRAM arrays and DRAM arrays as stand alone integrated circuits using dedicated semiconductor process techniques that are specifically optimized to produce space and power efficient DRAM devices. Sometimes a battery backed up SRAM is used as an alternative to more permanent storage such as non-volatile memory, e.g. FLASH or EEPROM memory. The battery maintains the data in the cells when the system is not supplying power to the memory to create "non-volatile" memory for long periods of time.

As semiconductor process technology advances have continued, recent fabrication technology has enabled the SRAM and DRAM arrays to be incorporated into large, highly integrated ICs, sometimes called "SOCs" or "systems on a chip." Typical applications for these embedded SRAMS include for use as register files, FIFOs, stacks and the like, and for fast memory adjacent a processor or controller core such as cache memory, as fast scratchpad memory, or to reduce the need for, or totally replace, discrete DRAM devices in systems where space is at a premium.

In conjunction with the increasing use of RAMs embedded with various other logic circuitry on a single integrated circuit, process technologies for manufacturing of integrated circuits continue to shrink. As the scaling of the dimensions of CMOS integrated circuitry gets smaller, certain dominant problematic effects become increasingly dominant. At the sub 100 nanometer manufacturing nodes, one such effect is that the threshold voltages for the transistors are highly variable. This effect must be compensated for to maintain reliable operation of the circuits.

FIG. 1 depicts a typical prior art 6T SRAM cell 11. 6T and 8T SRAM cells are described, for example, in U.S. Pat. Nos. 6,417,032 and 6,569,723, which are co-owned by the assignee of the present application and each of which is hereby incorporated by reference. In FIG. 1, access pass gate transistors PG1, PG2 are coupled to the word line WL and when the word line is active (high for an NMOS pass gate, low for a PMOS pass gate as is known in the art), the column or bit lines BL and BLZ are coupled to the simple cross coupled cell latch formed from two CMOS inverter pairs of pull up transistor PU1, pull down transistor PD1, and pull up transistor PU2, and pull down transistor PD2. The two inverters are cross-coupled to form a latch. As is known in the art, the latch will be overdriven for a write cycle by complementary data on the bit line pair, and that data will replace whatever data was previously stored in the cross coupled latch. In contrast, for a read cycle when no voltage is initially present on the bit lines BL and BLZ, and so the voltages at latch nodes I1, I2 will be output through the pass gates to provide read data for the bit lines. The bit lines BL and BLZ are differential, which is, the data on bit line BL during a read or write cycle will be the opposite of the data on bit line BLZ.

The use of complementary differential level bit lines as the data lines for the SRAM array enables the use of sense amplifiers. Sense amplifiers can sense a small, differential voltage difference presented on complementary column, or bit, lines and amplify the sensed differential voltage to a full logic level voltage. In this way the signals are made available as logic level signals for use as data by the remainder of the integrated circuit or system. Because the sense amplifier can be coupled to many storage cells, the area required for the sense amplifier transistors is not a disadvantage. Because the signals output by any particular cell in the memory array need not reach a full "logic" level, the speed of the cells can be increased for read and write cycles, as is well known in the art.

FIG. 2 depicts in a plan view a block diagram of a memory array of the prior art using SRAM cells 11 such as the one illustrated in FIG. 1 arranged in columns and rows, with a sense amplifier 13 coupled to a group of cells in a column. In FIG. 2, a plurality of SRAM cells 11 labeled "SRAM Cell" are coupled to a sense amplifier 13. Each SRAM cell 11 stores a bit of data and each are coupled to a word line. There is a word line driver for each row of the SRAM array and these are shown as WL0-WLN, with the replicator dots indicating there are many rows in the array. The columns are also replicated across the array, generally there is a column for each bit in a data word associated with the array, further it is known in the prior art to have millions of cells grouped into subarrays that are active during a cycle depending on a row and column address decode from control logic. Sense amplifiers 13 may be provided for each column in an array or subarray, preferably for larger arrays the sense amplifiers 13 are coupled to bit lines through multiplexers and de-multiplexers to share the sense amplifiers 13 and so minimize the silicon area required to implement the SRAM array.

FIG. 3 depicts an SRAM array comprised of subarrays 35 each having a plurality of memory cells 11 inside (not visible in the portion depicted). The memory cells are arranged as columns of cells, with each column being associated with one bit of a data word, the I/O buffers 39 couple the data lines (not shown) which run in a columnar direction, to a data bus. Wordline decoders 33 activate the particular word line associated with a row of the memory cells 11 within the subarrays 35, responsive to an address value received from outside the array. Each subarray of cells is coupled to a sense amplifier 37, which receives two data lines, usually called bit line or BL and a complementary bit line or BLZ. Control logic 41 provides the various signals to the sense amplifiers 37 and the I/O buffers 39 to cause the data presented at the I/O ports to be written to the appropriate row of memory cells, or, to cause stored data to be read from the appropriate row of memory cells so as to output data from the I/O buffers 39. All of these operations, and the circuits required, are well known in the art.

The use of improved semiconductor processing makes embedding RAM memory of both dynamic and static types along with other functional blocks more attractive in ASIC or semi-custom IC manufacture. Improved isolation and buried layer techniques, coupled with advanced photolithographic techniques, make it possible to provide the smaller transistor sizes and capacitors required for implementing a DRAM block in one portion of an integrated circuit, an SRAM block in another portion, while still processing a different portion of the integrated circuit to produce the larger transistors, and even analog components such as resistors, required for other applications, in a single piece of silicon. These advances make efficient and compact DRAM arrays even more important. FIG. 4 depicts a typical highly integrated circuit, ASIC or microprocessor of the prior art labeled IC1, having an I/O buffer portion, an embedded DRAM block A, an embedded SRAM block B, an external memory interface (sometimes called an "EMIF" block) a microprocessor core (which may include, inter alia, DSP, CPU, RISC, ARM and other types of microprocessor, microcontroller or programmable machine cores) and some user defined logic provided to make the integrated circuit particularly useful for a given purpose, perhaps analog to digital converters, sensors, image buffers, or the like.

In the SRAM art, it is known to vary the operating voltages supplied to the SRAM memory cells to attempt to improve the noise margins such as the static noise margins, for example. Providing a variable supply voltage depending on which portion of the operation cycle is being performed is one known prior art approach, however this approach requires a complex supply voltage line and extra control circuitry. A paper entitled "A 65 nm SoC Embedded 6T-SRAM Design for Manufacturing with Read and Write Stabilizing Circuits," to Ohbayahsi et al., published in the Digest of Technical Papers, 2006 Symposium on VLSI Circuits, IEEE (2006), proposes additional read access circuitry in the form of dummy or replica access transistors called "RATs" that match the access transistors in the cells. These normally "on" transistors lower or suppress the word line voltages supplied to the SRAM cells to improve the read noise margins. Another paper, entitled "Wordline and Bitline Pulsing Schemes for improving SRAM Cell Stability in low-Vcc 65 nm CMOS Design," to Khellah et al., published in the Digest of Technical Papers, 2006 Symposium on VLSI Circuits, IEEE (2006), also discloses added circuitry to address the SRAM operating stability. In this approach, a short pulse is used on the active word lines. While this short pulse on the word lines has a positive impact on the read cycle operating margins, the paper also describes that this approach actually has a negative impact for sense amplifier margins and for the write margins. The recommended approach disclosed in the paper adds a "write back" cycle to the read cycle. In the implementation provided by the paper to Khellah et al. the word line is pulsed twice for each cycle. This two pulse word line approach requires additional control circuitry complexity; power consumption is increased, and because the write back for each cycle means that each column requires its own dedicated sense amplifier, area is also greatly increased over more space efficient shared sense amplifier approaches.

The Khellah et al. paper also studied the impact of the bit line voltage on margins and found that if the bit line voltage were reduced slightly, the expected failure rate greatly improved. Khellah et al. proposes a circuit to lower the bit lines during a read operation just before the word lines are activated.

The SRAM prior art therefore provides a word line maintained at a single voltage during access cycles, and the noise margin problems of the cells are addressed inefficiently by the prior art. A need thus exists for an improved approach to increasing the static noise margins for SRAM cells implemented with transistors fabricated at the present semiconductor process nodes, including some compensation for the problems associated with the large variability in the transistor threshold voltages, without increases in circuit area or power consumption.

SUMMARY OF THE INVENTION

These and other problems are generally solved or circumvented, and technical advantages are generally achieved, by embodiments of the present invention, which provide circuits and methods of forming access circuitry for an SRAM device for use in an integrated circuit which solves the noise margin problems described above by providing a timing circuitry coupled to the word line decoders used to address the SRAM cells. These timing circuits create a two phase word line pulse and provide a method of operation that compensates for the variable threshold voltages of the transistors and the operating margins of the SRAM cells. The preferred embodiments of the invention advantageously provide a word line pulse that is suppressed for a first portion of the access cycle and then rises to a higher voltage for the last portion of the cycle. In this manner the required improved operating margins are provided to compensate for the reduced margins that result from the variable transistor threshold voltages, without the inefficiencies associated with the prior known approaches.

In one preferred embodiment of the circuitry of the invention, a first timing circuit is provided and a second timing circuit is provided, observation circuitry is utilized to monitor the changes in the bit line voltages, and after a predetermined threshold is reached on a falling bit line during an access cycle, a word line suppression circuit is disabled and the word line is allowed to rise from a first voltage that is less than a supply voltage by a delta voltage amount, to an unsuppressed supply voltage level. The suppression circuit on the word line may also be activated during power down cycles to reduce or save power consumption. The timing and access circuitry provided in the preferred embodiments of the present invention circumvent the need for added sense amplifiers or other circuitry as used in the prior art approaches, thus the area penalty for the improved performance of the SRAM incorporating the features of the present invention is minimal and is better than the area penalty associated with the known prior art solutions.

In a first preferred embodiment, a word line suppression circuit element is provided coupled to each word line. In one embodiment this element may be a MOS transistor, in another alternative preferred embodiment; this element may be a diode or other controlled suppression circuit. A first timing circuit is provided that outputs first word line controls signal. A second timing circuit is provided that outputs second word line controls signal. The word line suppression circuit is normally "on." The word line pulse is divided into two phases, during the first phase, the first timing circuit provides the first word line control signal and the second timing circuit provides the second word line control signal. During the first phase, the word line decoders are enabled and the bit line voltages are monitored by the first timing circuit. During the first phase, a word line suppression circuit is active and the word line is allowed to rise to a voltage that is a delta voltage or dV less than the supply voltage Vdd. In this manner, when the bit lines are at a high voltage at the beginning of the cycle, the word lines are suppressed to a lower voltage, thus improving the noise margins for a "read" operation.

When the falling bit line is detected discharging past a predetermined threshold in response to the word line being activated, the first timing circuit stops outputting the first word line control signal and the second phase begins. During the second phase, the second timing circuit continues outputting the second word line control signal until the falling bit line discharges past a second predetermined voltage. During the second phase, the word line suppression circuit is disabled, and therefore the word line is allowed to increase to a higher, unsuppressed voltage. In this manner the second phase provides a higher word line voltage during the time that the bitlines are at a lower voltage, thus increasing the margins for a "write" operation.

In a preferred method of operating an SRAM, a two phase word line pulse is provided. A word line suppression circuit coupled to the active word line and enabled by timing circuitry is operated to provide a word line voltage in a first phase of an access cycle that is less than the supply potential by a delta voltage, so that during the first phase of an access cycle the word lines are at a voltage that is less than the starting voltage for the bit lines by a delta voltage. During a second phase of the access cycle, the word line suppression circuit is disabled so that the word line rises to the full supply potential, thus when the bit lines are at a lower voltage, the word line is at a higher voltage, this increases the margins for a "write" cycle.

In one preferred embodiment the circuitry and methods of the invention are used in a discrete SRAM integrated circuit. In another preferred embodiment, integrated circuits incorporating the SRAM of the invention may embed the SRAM including the access timing circuitry with various other functions including processors, additional embedded DRAM blocks, I/O circuitry, clocking circuitry, DAC/ADC converters, and the like, to form large systems on a chip (SOCs) as is known in the art.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
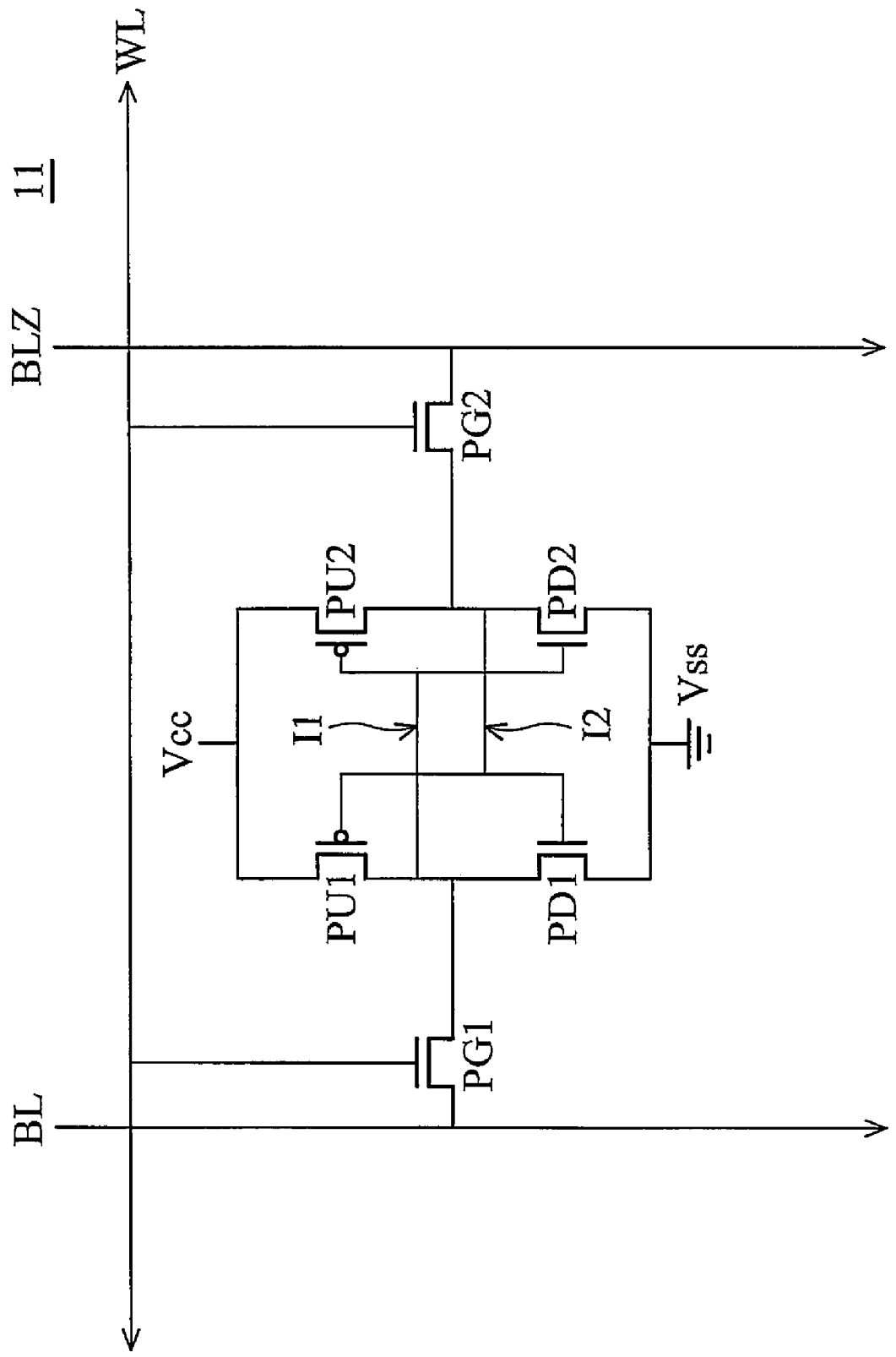
FIG. 1 illustrates an SRAM memory cell of the prior art.
Figure 2:
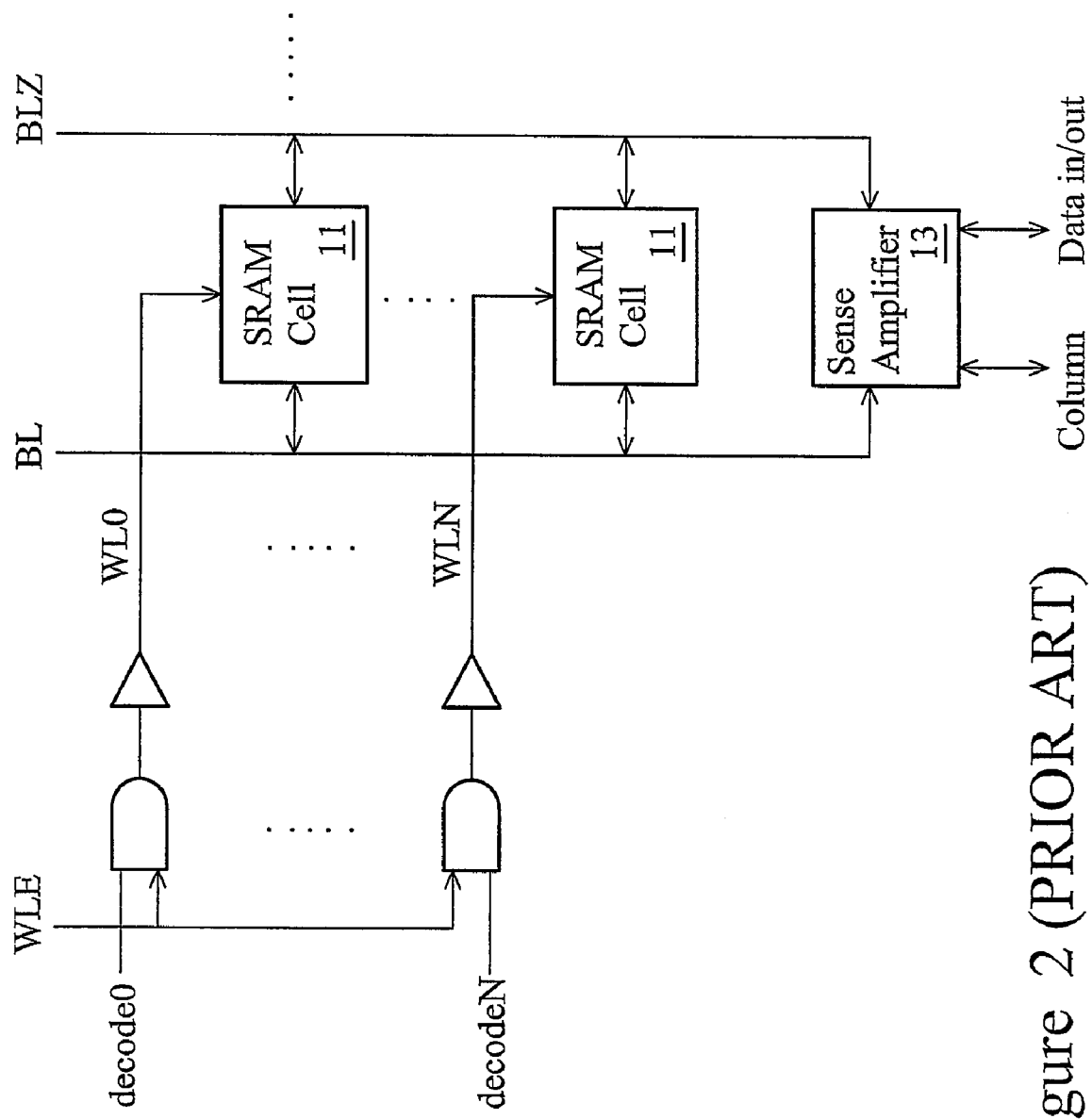
FIG. 2 illustrates a simplified block diagram of a portion of an SRAM cell array of the prior art including decoders and a sense amplifier.
Figure 3:
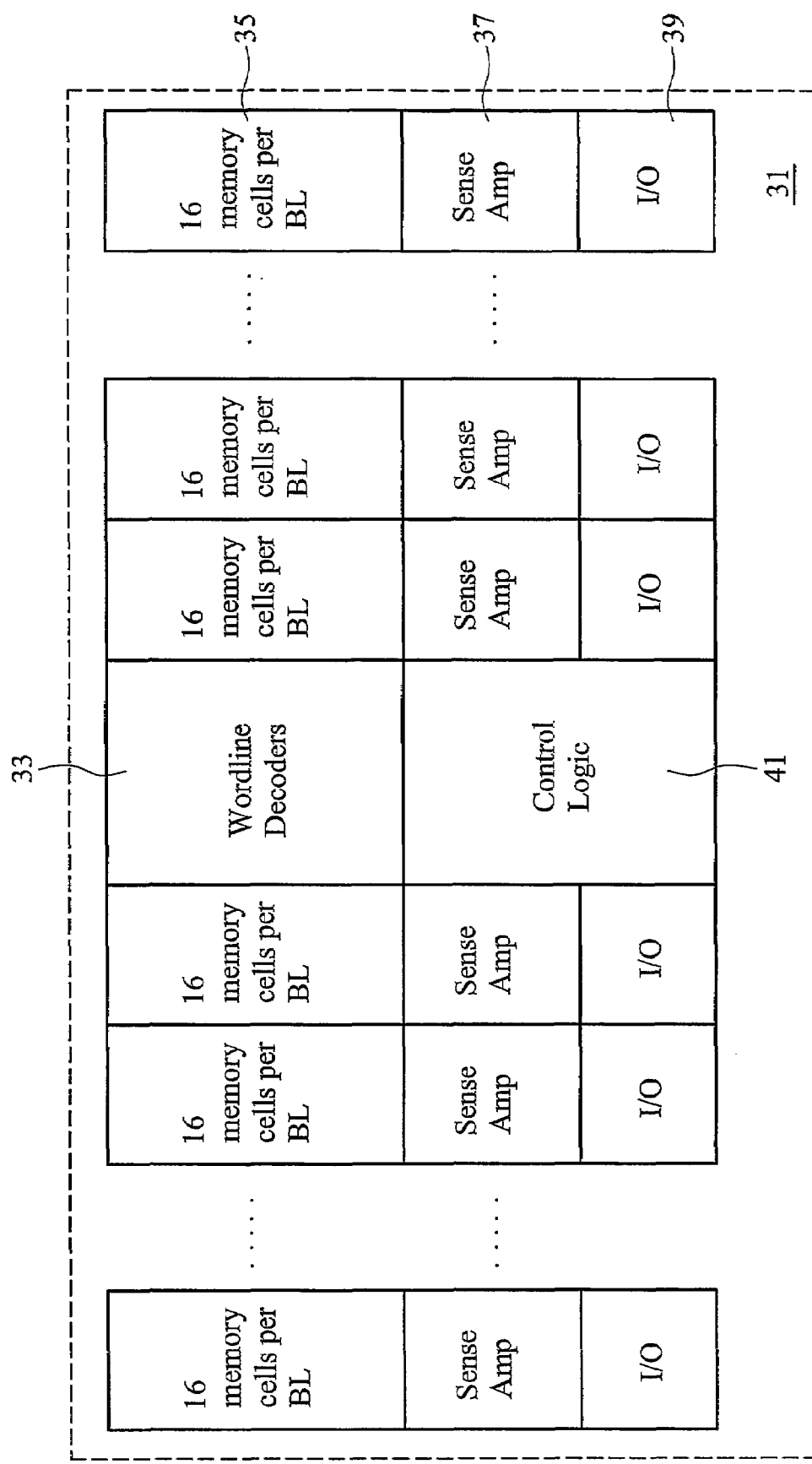
FIG. 3 illustrates in a simplified block diagram a portion of an SRAM cell array of the prior art.
Figure 4:
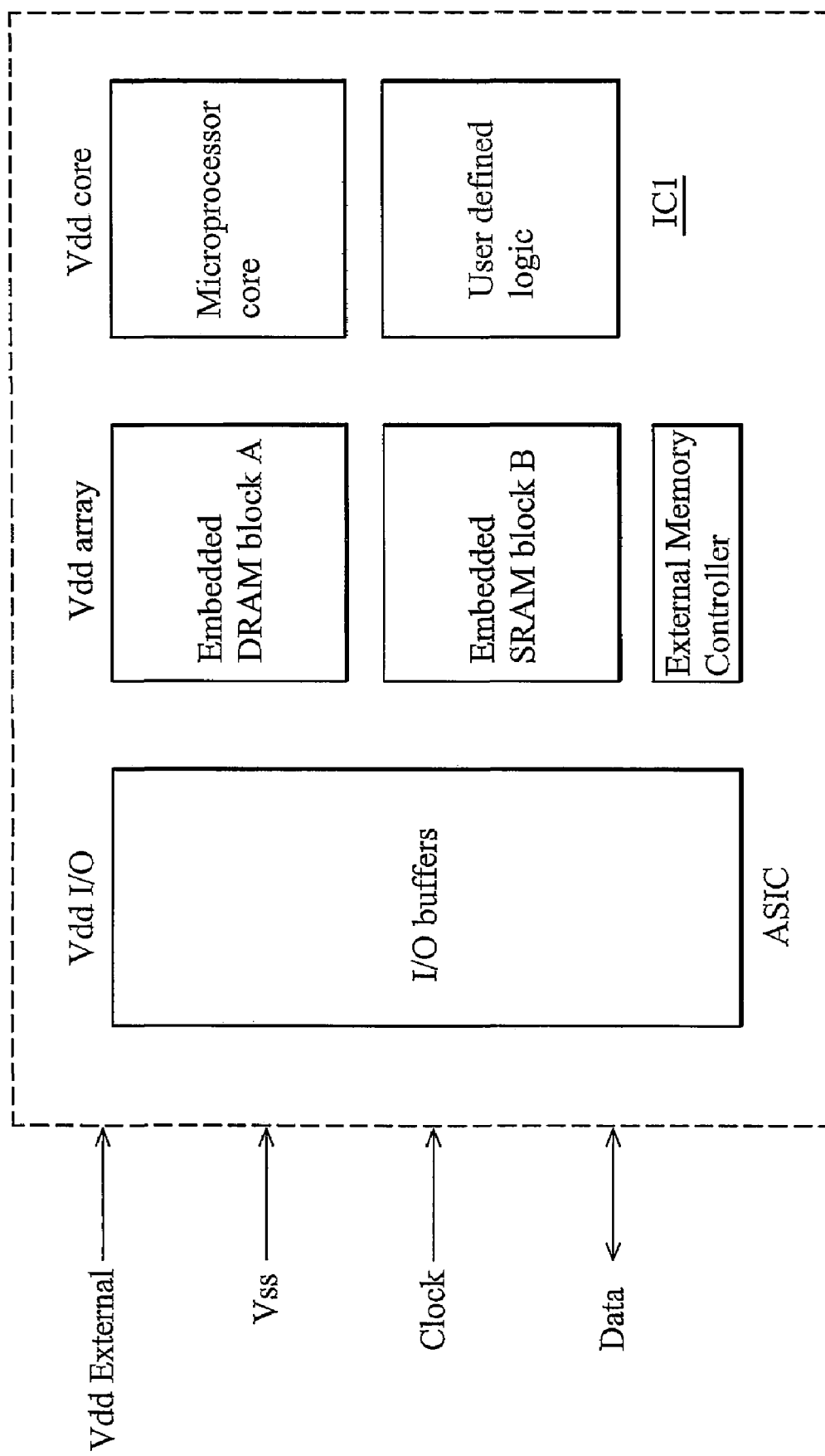
FIG. 4 illustrates in a simple plan view a block diagram of an integrated circuit incorporating an embedded SRAM array with other circuitry.
Figure 5:
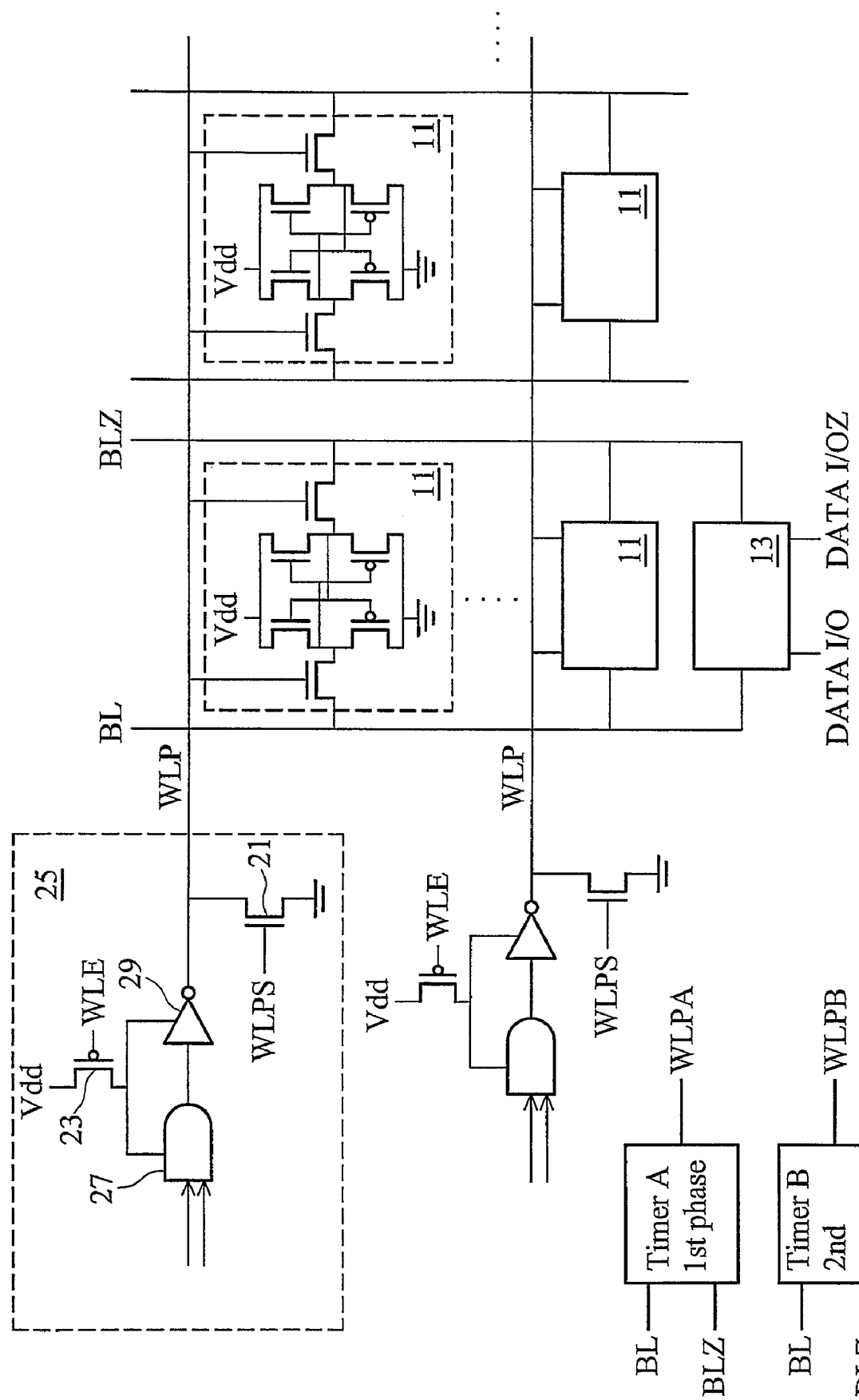
FIG. 5 illustrates a schematic view of the word line suppression circuitry and timing of a preferred embodiment of the invention in an SRAM circuit.

FIG. 5 depicts in a simple schematic view a first preferred circuit embodiment of the SRAM array incorporating the invention. An array of SRAM cells 11, shown in this exemplary circuit as 6T cells, is arranged in rows and along columns. Typically, each column will be associated with a bit in a data word that is input and output using I/O circuitry (not shown in this view) but other arrangements are also possible. In FIG. 5, the columns are each associated with a pair of column or bit lines that are differential and complementary bit lines, labeled BL and BLZ. As is known in the art, each column of SRAM cells 11 is also associated with a sense amplifier 13; these may be shared among columns using multiplexers and de-multiplexers, or dedicated to a single column of cells. The sense amplifier 13 provides an input and output for the data from the data input/output lines labeled DATA I/O and DATA I/OZ. For a "read" cycle, data is sensed from the selected SRAM cell 11 accessed by the active wordline WLP, the sensed data is then amplified by sense amplifier 13 and coupled to the data lines DATA I/O and DATA I/OZ. For a "write" cycle, the data is provided at the DATA I/O and DATA I/OZ lines and is coupled to the bit lines at the beginning of the access cycle, this data is coupled to the selected SRAM cell by the active wordline WLP and at the end of the access cycle, written into the SRAM cell for later retrieval in a subsequent "read" cycle.

The active row of cells is determined by the word lines, after the word line decoders complete decoding row address information. FIG. 5 depicts word line decoders 25. The decoders are shown as logic gates 27 and are followed by an inverting word line driver 29 in FIG. 5; however other arrangements are known in the art and may be used. As shown in FIG. 5, a PMOS enable transistor 23 couples the word line decoders 25 to the supply voltage Vdd when the enable signal WLE provided from control circuitry (not shown in this figure) is active, here an "active low" signal is used to enable the PMOS transistors 23. Also shown in FIG. 5 is the word line suppression element 21, in this exemplary preferred embodiment an NMOS transistor is shown. This transistor is coupled to a control line WLPS which is developed from two timing signals WLPA and WLPB from the two timing circuits Timer A and Timer B, for the first and second phases of a two-phase word line operation as described below.

In the first phase of the preferred method of developing the word line signal, the Timer A will activate one word line WLP in the array or sub array, based on the address that is decoded. During the first phase, the suppression control signal WLPS is active and so the word line voltage is suppressed by the operation of the suppression element 21, which will lower the word line voltage by a predetermined voltage dV. This voltage is determined by dividing the supply voltage Vdd output by the enable transistor 23 across the voltage divider comprised of the PMOS transistor in the driving inverters 29 and the NMOS transistor 21, by proportionally sizing these MOS transistors a desired voltage less than the supply voltage (Vdd−dV) is provided on the active word line WLP. Transistor sizing to output a predetermined voltage is known to those skilled in the art. In a preferred embodiment the circuitry would suppress the active word line voltage by 50 millivolts for example, which for a read operation will improve the noise margins, as described above.

In this preferred embodiment, the Timer A circuit continues to output a signal WLPA until one of the bit lines is observed falling by a predetermined amount, for example, 50 millivolts. When the falling bit line has reached this threshold, the first timer circuit Timer A will stop outputting the signal WLPA. At this point, the second timer circuit Timer B will continue to output signal WLPB and will continue to monitor the bit line voltage. When this condition is true, the control signal WLPS, which is normally "high" falls low, thereby disabling the normally "on" suppression element, transistor 21. The active word line WLP then rises to the full voltage supply potential Vdd output by the enable transistor 23. At this time, the second phase of the word line pulse is developed, that is the word line voltage is higher in the second phase of the word line cycle. For a 'write' cycle this is the critical phase and thus the word line suppression of phase 1, which improves the margins for an SRAM read cycle, is removed in phase 2, and so does not impair the noise margins for the sense amplifier and the write cycle. This novel method of operating the word lines in two phases thus overcomes the problems with the prior art approaches while still improving the margins for the read and write cycles.

Figure 6:
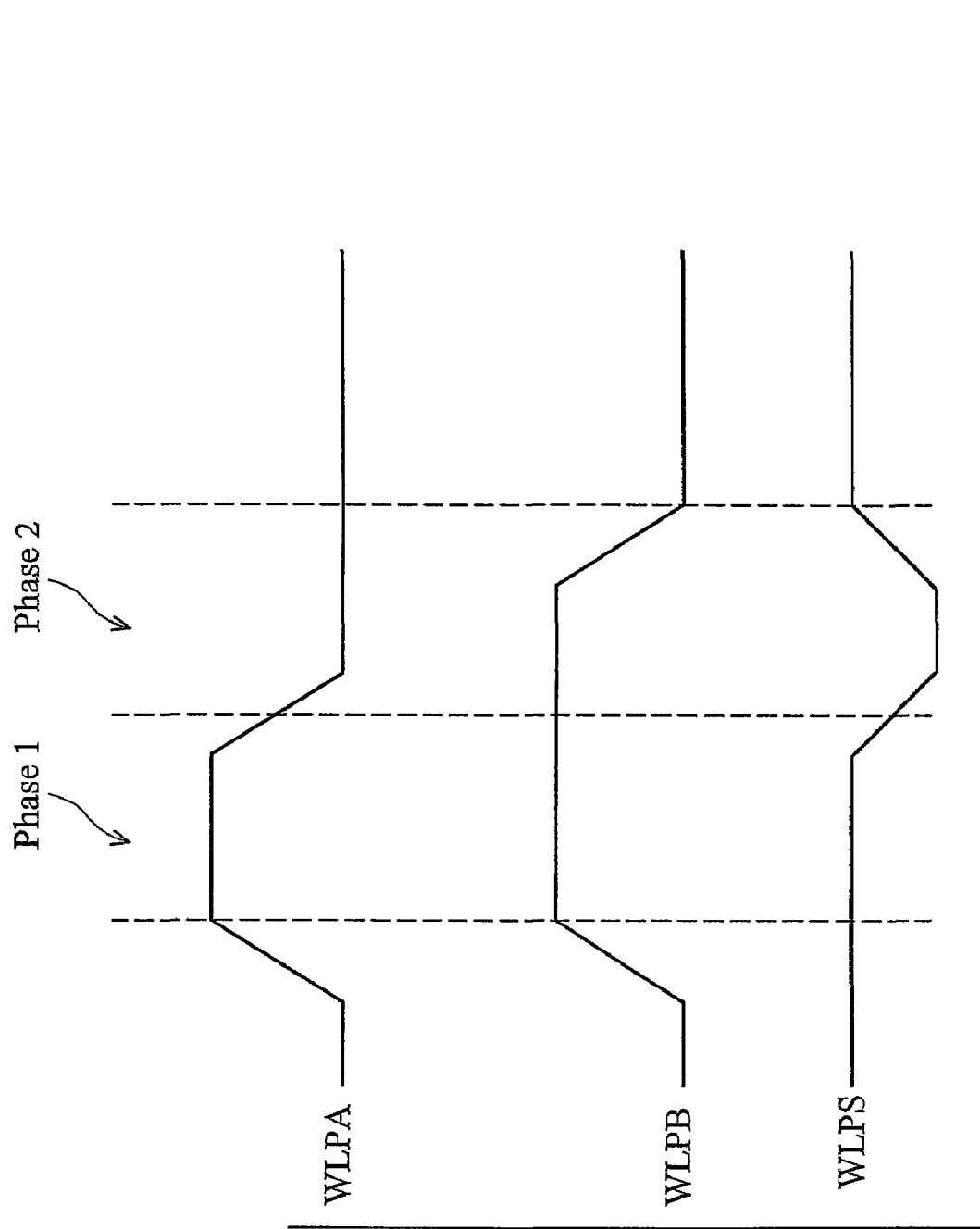
FIG. 6 depicts a timing diagram of signals shown in FIG. 5.

FIG. 6 is a timing diagram depicting the operations of the signals WLPA, WLPB and the control signal WLPS which depends on WLPA and WLPB and which controls the word line suppression element, e.g. transistor 21 in FIG. 5. In FIG. 6, the signal WLPS is normally high and it can be seen that during phase 1 of the word line pulse during an access cycle, the signal remains high, then in phase 2 of the word line pulse of the access cycle, when WLPA is low (bit line discharge has been detected over the threshold, e.g. 50 millivolts) while WLPB is still high (bit line has not discharged to the second threshold, e.g. 100 millivolts) the signal WLPS goes low, disabling the suppression circuit (transistor 21 in FIG. 5) and allowing the word line voltage to rise to its full potential.

Figure 7:
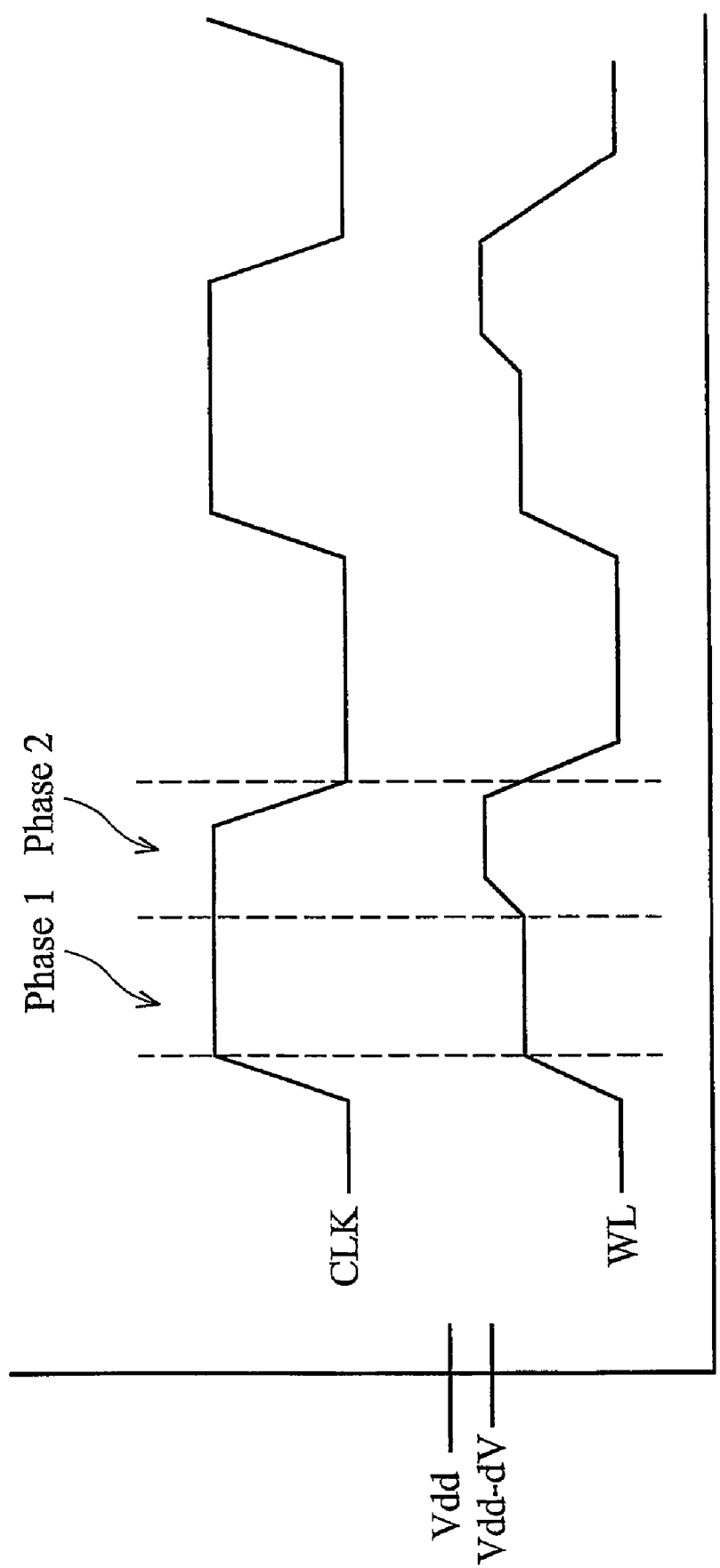
FIG. 7 depicts a timing diagram of the word line pulse of a preferred embodiment of the invention.

FIG. 7 illustrates in a timing diagram the word line pulse of the active word line of FIG. 5 depicted over a couple of clock cycles. The word line is suppressed during phase 1 as shown in FIG. 6 to a voltage less than the full Vdd potential by a delta voltage dV. As described above, circuit design techniques may be used to develop a suppressed voltage Vdd−dV that is determined by the relative sizes of the transistors 21 and 23 and the word line driver 29 in FIG. 5. An example dV of 50 millivolts is one advantageous alternative, and other voltages may be used. During Phase 2, when the control voltages WLPA and WLPB have opposite polarity as shown in FIG. 6, the active word line is allowed to rise to its full Vdd potential. For a write cycle this improves the operating margins, while the suppressed word line voltage made available during Phase 1, as shown in FIGS. 6 and 7, improves the margins of a read cycle.

Although the word line suppression circuit of FIG. 5 depicts an illustrative preferred embodiment using an N channel MOS transistor as the suppression device, a diode or other pull down circuit may be used as an alternative preferred embodiment. The suppression circuit need only provide a suppressed voltage on the word line during Phase 1 of the timing diagram, and not during Phase 2 of the timing diagram; one skilled in the art will recognize that various circuit elements may be used with the timing circuitry to provide this suppression delta voltage dV. In other words, in one preferred embodiment the word line suppression circuitry comprises a voltage controlled current path selectively coupled between the word line and a reference potential for suppressing the word line voltage responsive to the voltage on a suppression control signal. In the exemplary implementation of the embodiment of FIG. 5, the pull down circuit is an MOS transistor, for example an N MOS transistor, having the source-drain current path coupled between the word line and a reference potential and controlled by a control signal at its gate electrode. Other implementations of the suppression circuit are contemplated and are within the scope of the invention and are covered by the appended claims.

The word line suppression circuit, whether a transistor or other device, may also be used at certain times in the operation of the circuitry to reduce power consumption by suppressing the word line to a lower voltage. Thus the timing circuitry and the word line suppression circuitry may have multiple functions, to improve the margins of operation and to reduce power consumption during power down, power up, standby and other operations.

Table 1 depicts the advantageous effects of the use of preferred embodiments of the invention. In Table 1, the bit line voltage level is shown in a column labeled "BL Level", the word line (active word line) level is shown in the column labeled "WL Level" and the performance criteria "Beta Ratio" and "Dynamic Noise Margin" are shown, for the two situations depicted in the rows, e.g. Phase 1 and Phase 2 of an access cycle using the invention.

TABLE 1

| Word Line | Bit Line Level | Word Line Level | Beta Ratio | Dynamic Noise Margin |
|---|---|---|---|---|
| Phase 1 | VDD | VDD-dV | High | OK |
| Phase-2 | VDD-dV | VDD | Low | OK |

Figure 8:
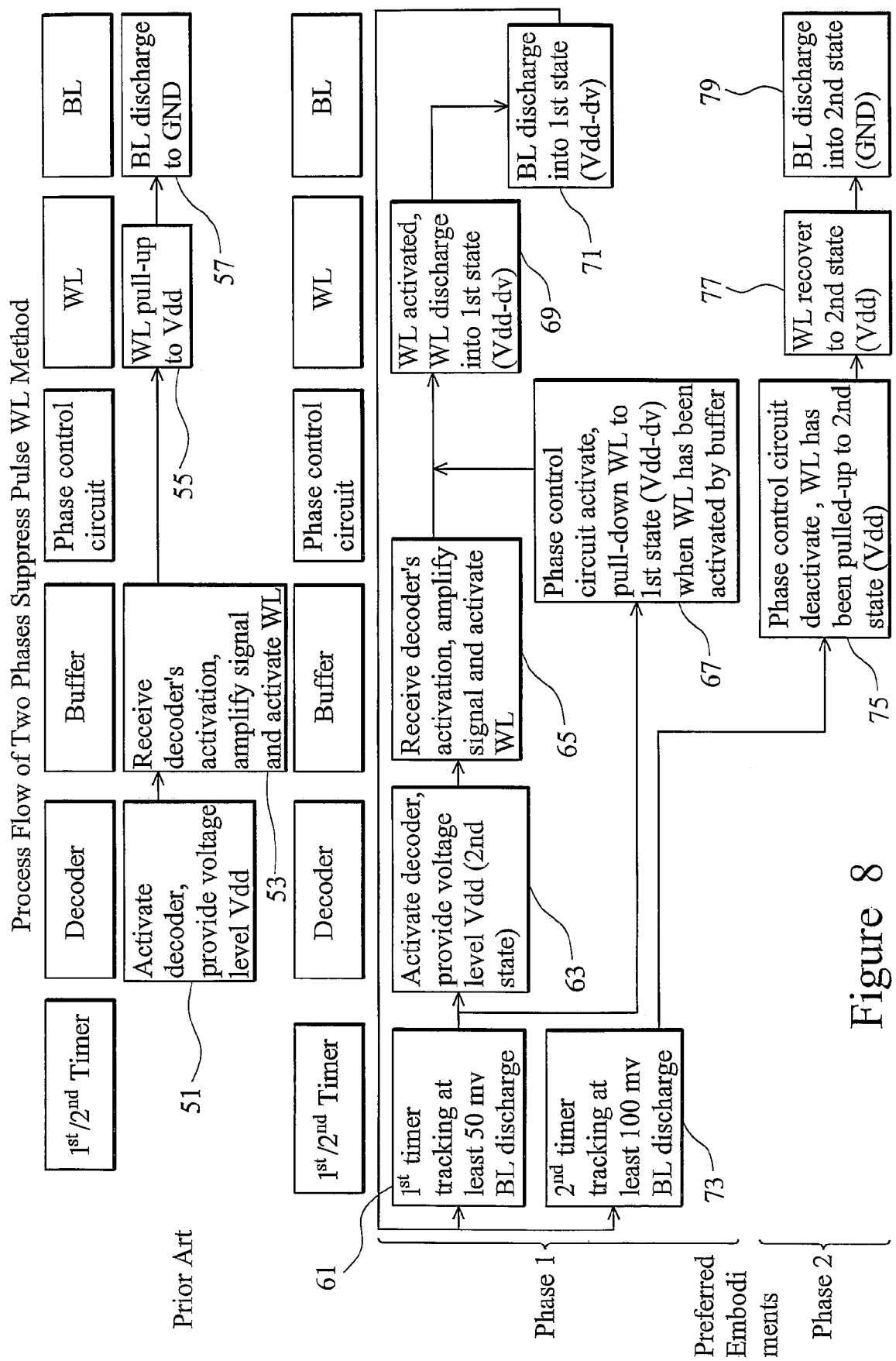
FIG. 8 depicts a pair of flow diagrams for comparison between the process steps of the prior art word line decoder approach, and the two phase word line pulse approach of the present invention.

FIG. 8 depicts, in a horizontal reading flow chart, a comparison between the prior art approach to the word line pulse and the two phase word line pulse approach of the preferred embodiments of the present invention.

In FIG. 8, step 51 illustrates the beginning of the prior art word line cycle. In step 51, the decoder supplying the word line pulse in response to a word line address field is activated. In the step labeled 53, a circuit driving the word line, e.g. a buffer circuit, receives the output of the decoder circuitry and activates a word line pulse on a selected word line. In the step labeled 54, the word line voltage increases to the positive supply voltage, e.g. Vdd. In the prior art SRAM circuitry using the prior word line pulse approach, the corresponding bit lines discharge to a reference potential voltage, typically ground. (GND).

In contrast, the second row of the horizontal flow chart of FIG. 8 illustrates the steps of the two phase word line pulse of the preferred embodiment. In the row labeled "Phase 1", the two phase word line cycle begins. In step 61, the first timing circuitry is enabled to begin observing the bit line voltage and is given a discharge threshold, for example, 50 millivolts from the starting voltage. In step 63, the word line decoder provides a word line voltage level in response to detecting a word line address value selecting the corresponding word line for a pulse. In step 65, a driving circuit, for example the buffer 25 of FIG. 5, begins the word line pulse by driving the word line. In step 67, which may happen roughly simultaneously or contemporaneously with step 65, the phase control circuit causes the word line suppression circuit to activate (because the first timer has not yet detected the bit line falling below the first threshold). In step 69, the word line is activated and is suppressed to a $1^{st}$ discharge state, typically this voltage will be Vdd–dV, as described above dV is the suppression voltage.

In step 71 of the "Phase 1" row of the flow diagram of FIG. 8, in response to the active word line pulse the corresponding bit line begins to discharge to a first discharge state (Vdd–dV).

It should be recognized from noting the return arrow exiting step 71 and returning to step 61 that the word line remains active in Phase 1, with the suppression circuitry active, until the first timer detects that the bit line has discharged past the first threshold. At that time the first control signal is inactive as shown in the timing diagram of FIG. 7.

Now the process enters the Phase 2 part of the flow diagram. In the row labeled "Phase 2" the word line suppression circuit is deactivated until the second timer detects the corresponding bitline has discharged beyond the second threshold (as indicated in step 73), until that threshold is reached the phase control signal for the second timer remains active, but the first phase control signal is inactive, and as indicated in the timing diagram of FIG. 7 the word line suppression circuit is deactivated in Phase 2 (as also shown in step 75 of the flow diagram). The word line pulse now rises to its full voltage potential without suppression, e.g. Vdd. This is illustrated in step 77 of FIG. 8. Finally, the bit line corresponding to the word line pulse will discharge to the full reference potential (e.g. ground or GND).

Accordingly, preferred methods and circuits of the invention thus provide an SRAM with a two phase word line and improved margins for read cycles and write cycles. The use of the circuits and methods of the invention provide particular advantages for circuits implemented in sub 100 nanometer processes and for other circuits subject to highly variable transistor threshold voltages.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An SRAM circuit, comprising:
   a plurality of static memory storage cells arranged in a column and each coupled to a word line from a plurality of word lines arranged in rows;
   a pair of complementary bit lines coupled to the plurality of static memory storage cells for transmitting differential data signals to and from the static memory storage cells;
   a differential sensing amplifier having a pair of differential inputs each coupled to one of the pair of complementary bit lines and operable for sensing the differential voltage between the differential inputs;
   input/output data lines for transmitting and receiving data from the sense amplifier in response to control signals; and
   word line decoder circuitry for outputting a pulse on a selected one of the word lines in response to decoding an address, the word line decoder circuitry further comprising word line suppression circuitry for selectively lowering the voltage on the word line by a predetermined amount during a first phase of a pulse on the word line, and for releasing the word line allowing the word line to rise to a higher voltage during a second phase of the a pulse on the word line.

2. The SRAM circuit of claim 1, wherein the word line decoder circuitry further comprises a first suppression timer circuit that outputs a first control signal at the beginning of the first phase of the word line pulse and continues to output the control signal until one of the differential bit lines falls to a first predetermined voltage that is lower than the initial voltage, and a second suppression timer circuit that outputs a second control signal at the beginning of the first phase of the word line pulse and continues to output the control signal until the one of the differential bit lines falls to a second predetermined voltage that is lower than the first predetermined voltage.

3. The SRAM circuit of claim 1, wherein the second phase of the word line pulse is determined when the second control line is active and the first control line is inactive, and the word line suppression circuit is inactive during the second phase of the word line pulse.

4. The SRAM circuit of claim 1, wherein the word line suppression circuitry suppresses the word line voltage by a voltage not less than 50 millivolts.

5. The SRAM circuit of claim 2, wherein the first predetermined voltage is a voltage not less than 50 millivolts.

6. The SRAM circuit of claim 2, wherein the word line suppression circuitry comprises a circuit element selected from the group of: a MOS transistor, a diode, and a logic element.

7. The SRAM circuit of claim 1, wherein the word decoder circuitry further comprises an enable circuit operable to output a supply voltage to the word line responsive to a control signal.

8. The SRAM circuit of claim 7, wherein the enable circuit is a MOS transistor coupled with its source drain current path between a positive voltage supply and the word line and the gate terminal coupled to an enable signal.

9. The SRAM circuit of claim 7, wherein the enable circuit and the word line suppression circuitry act as a voltage divider to output a first predetermined voltage on the word line when the word line suppression circuitry is active, and to output a second greater voltage on the word line when the word line suppression circuitry is inactive.

10. An integrated circuit including an embedded SRAM array, comprising:
input/output circuitry for receiving and transmitting signals including data signals;
logic circuitry for performing user defined functions coupled to said data signals;
an embedded SRAM circuit, comprising:
a plurality of static memory storage cells in a plurality of arrays arranged in rows and columns and coupled to a complementary bit line pair for transmitting and receiving data to and from the memory storage cells;
a sense amplifier coupled to the complementary bit line pairs in each of the columns comprising a differential latch circuit for latching the differential voltage between a pair of differential input sensing nodes each coupled to one of the pair of complementary bit lines;
word lines coupled to the static memory storage cells along said rows;
word line decoder circuitry coupled to the word lines for outputting a two phase word line pulse on a selected word line responsive to an row address, the word line decoder circuitry further comprising word line suppression circuitry for suppressing the voltage on the word line during a first phase of a word line pulse and for releasing the voltage one the word line to a higher voltage during a second phase of the word line pulse, the word line suppression circuitry selectively enabled responsive to a suppression control signal; and
input/output data lines coupled to each column to provide data into the memory cells and sense amplifiers and to receive data from the memory cells and sense amplifiers during write and read operations.

11. The integrated circuit of claim 10, wherein the word line suppression circuitry in the embedded SRAM circuit further comprises a voltage controlled current path selectively coupled between the word line and a reference potential responsive to the voltage on a suppression control signal.

12. The integrated circuit of claim 11, wherein the word line suppression circuitry in the embedded SRAM is normally on and suppresses the voltage on the word line.

13. The integrated circuit of claim 11, wherein the word line decoder circuitry in the embedded SRAM further comprises a first suppression timer circuit that outputs a first control signal at the beginning of the first phase of a word line pulse and continues to output the control signal until one of the differential bit lines falls to a first predetermined voltage that is lower than the initial bit line voltage, and a second suppression timer circuit that outputs a second control signal at the beginning of the first phase of the word line pulse and continues to output the control signal until the one of the differential bit lines falls to a second predetermined voltage that is lower than the first predetermined voltage.

14. The integrated circuit of claim 10, wherein for the embedded SRAM circuit the second phase of the word line pulse is determined when the second control line is active and the first control line is inactive.

15. The integrated circuit of claim 14 wherein for the embedded SRAM circuit the word line suppression circuitry is controlled by a suppression control signal derived from the first and second control signals, and the word line suppression circuit is inactive during the second phase of the word line pulse.

16. The integrated circuit of claim 10, wherein for the embedded SRAM circuit the word line suppression circuitry suppresses the word line voltage by a voltage not less than 50 millivolts.

17. The integrated circuit of claim 10, wherein for the embedded SRAM circuit the word line suppression circuitry comprises a circuit element selected from the group of a MOS transistor, a diode, and a logic circuit.

18. The integrated circuitry of claim 10, wherein for the embedded SRAM circuit the word decoder circuitry further comprises an enable circuit operable to output a supply voltage to the word line responsive to a control signal.

19. A method for supplying a word line to an SRAM array, comprising:
providing one or more word line decode circuits coupled to word line address signals for supplying at least one word line pulse on at least one word line responsive to a detected word line address on the word line address signals;
providing word line suppression circuitry coupled to the at least one word line for suppressing the voltage on the word line responsive to a word line suppression control signal; and
transmitting a two phase word line pulse on the selected word line responsive to an enable signal, the word line suppression circuitry being active during a first phase to suppress the voltage on the word line to a voltage less than a supply voltage, the word line suppression circuitry being inactive during a second phase to allow the word line voltage to rise to a voltage greater than the suppressed word line voltage.

20. The method of claim 19, and further comprising:
observing the voltage of a bit line corresponding to a memory cell selected by the at least one word line and providing a first control signal during the first phase of the word line pulse, and continuing to output the first control signal until the voltage observed on the bit line discharges to a level below a first predetermined threshold from the bit line starting voltage;

observing the voltage of the bit line corresponding to a memory cell selected by the at least one word line and providing a second control signal during the second phase of the word line pulse and continuing to output the second control signal until the voltage of the observed bit line discharges to a voltage below a second predetermined threshold voltage from the bit line starting voltage, the second predetermined threshold being greater than the first predetermined threshold; and deriving the suppression control signal from the first and second control signals, wherein the suppression control signal is normally active and is inactive when the first control signal is inactive and the second control signal is active.

21. The method of claim 19, wherein the first phase of the word line pulse is defined as the period when both the first and second control signals are active, and the second phase of the word line pulse is defined as the period when the first control signal is inactive and the second control signal is active.

22. The method of claim 19, wherein providing the word line suppression circuitry further comprises providing a circuit element with a voltage controlled current path coupled between the word line and a reference potential, and having a control terminal coupled to the suppression control signal.

23. The method of claim 19, wherein providing the word line suppression circuitry further comprises providing a MOS circuit element selected from the group of a MOS transistor, a diode, and a logic circuit; and coupled between the word line and a reference potential.

* * * * *

UNITED STATES PATENT AND TRADEMARK OFFICE
CERTIFICATE OF CORRECTION

PATENT NO. : 7,505,345 B2  
APPLICATION NO. : 11/811659  
DATED : March 17, 2009  
INVENTOR(S) : Wang et al.

Page 1 of 1

It is certified that error appears in the above-identified patent and that said Letters Patent is hereby corrected as shown below:

In Col. 1, line 37, delete "effect" and insert --effective--.  
In Col. 10, line 57, delete "the a" and insert --the--.  
In Col. 11, line 53, delete "an" and insert --a--.  
In Col. 11, line 57, delete "one" and insert --on--.

Signed and Sealed this

Twenty-eighth Day of April, 2009

JOHN DOLL  
*Acting Director of the United States Patent and Trademark Office*